(12) United States Patent
Myoung et al.

(10) Patent No.: US 10,187,122 B2
(45) Date of Patent: Jan. 22, 2019

(54) NEAR FIELD COMMUNICATIONS DEVICE

(71) Applicant: Samsung Electronics Co., Ltd., Suwon-si, Gyeonggi-do (KR)

(72) Inventors: Seong Sik Myoung, Suwon-si (KR); Jun Ho Kim, Yongin-si (KR); Sang Hyo Lee, Incheon (KR); Il Jong Song, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/666,914

(22) Filed: Aug. 2, 2017

(65) Prior Publication Data

US 2018/0241440 A1  Aug. 23, 2018

(30) Foreign Application Priority Data

Feb. 22, 2017 (KR) .................. 10-2017-0023486
Apr. 11, 2017 (KR) .................. 10-2017-0046739

(51) Int. Cl.
*H04B 5/02* (2006.01)
*H03F 3/19* (2006.01)
*H03F 3/21* (2006.01)
*H03G 3/30* (2006.01)
*H02M 3/04* (2006.01)

(52) U.S. Cl.
CPC .................. *H04B 5/02* (2013.01); *H03F 3/19* (2013.01); *H03F 3/21* (2013.01); *H03G 3/3036* (2013.01); *H02M 3/04* (2013.01)

(58) Field of Classification Search
CPC .......... H04B 5/00; H04B 5/02; H04B 5/0062; H04B 5/0075; H03F 3/19; H03F 3/191; H03F 3/21; H03G 3/3036
See application file for complete search history.

(56) References Cited

U.S. PATENT DOCUMENTS

| 7,116,946 | B2 | 10/2006 | Tanabe et al. | |
|---|---|---|---|---|
| 8,036,623 | B2 | 10/2011 | Chang et al. | |
| 9,020,451 | B2 | 4/2015 | Khlat | |
| 9,362,825 | B2 | 6/2016 | Southcombe et al. | |
| 9,425,690 | B2 | 8/2016 | Min et al. | |
| 9,425,749 | B2 | 8/2016 | Gulko et al. | |
| 2010/0245052 | A1* | 9/2010 | Kitayoshi | H04B 5/02 340/10.4 |
| 2014/0091634 | A1* | 4/2014 | Mayo | H04B 5/0075 307/104 |

(Continued)

FOREIGN PATENT DOCUMENTS

JP   2011-035500 A   2/2011
KR     1417962 B1    7/2014
(Continued)

*Primary Examiner* — Thanh Le
(74) *Attorney, Agent, or Firm* — Myers Bigel, P.A.

(57) ABSTRACT

A near field communications (NFC) device includes a receiving module and a transmitting module. The receiving module includes a receiver receiving an analog signal that includes a carrier signal and data, an analog-to-digital converter converting the analog signal to a digital signal, and a filter filtering the digital signal. The transmitting module includes a direct current-direct current (DC-DC) converter having an operating frequency belonging to a stop band of the filter, and a transmitter receiving power from the DC-DC converter and receiving a system clock signal.

20 Claims, 11 Drawing Sheets

(56) References Cited

U.S. PATENT DOCUMENTS

2015/0105016 A1* 4/2015 Lefley .................. H04B 5/0075
                                                         455/41.1
2015/0162824 A1   6/2015 Philip
2015/0207404 A1   7/2015 Philip
2015/0207616 A1* 7/2015 Choke ...................... H04B 5/00
                                                         455/41.1

FOREIGN PATENT DOCUMENTS

KR      1414712 B1    8/2014
KR      2015-0030107 A   3/2015

\* cited by examiner

NEAR FIELD COMMUNICATIONS DEVICE

CROSS-REFERENCE TO RELATED APPLICATIONS

This application claims benefit of priority to Korean Patent Application No. 10-2017-0046739, filed on Apr. 1, 2017 and Korean Patent Application. No. 10-2017-0023486, filed on Feb. 22, 2017 in the Korean Intellectual Property Office, the disclosures of which are incorporated herein by reference in their entireties.

BACKGROUND

1. Field

The present inventive concept relates to a near field communication (NFC) device.

2. Description of Related Art

Near field communication (NFC) technologies are communications technologies that may enable data exchange within a short distance, using a signal having a specific frequency bandwidth, and have been applied in various fields, due to advantages such as a high level of security and the like. In recent years, NFC devices providing NFC functions have been mounted in various types of electronic devices, and mobile devices may provide the user with electronic payment functions used in transportation cards, credit cards, and coupons, and data exchange functions using the NFC function.

SUMMARY

An aspect of the present inventive concept may provide a near field communication (NFC) device having improved communications performance and power consumption efficiency.

According to an aspect of the present inventive concept, an NFC device may include a receiving module and a transmitting module. The receiving module includes a receiver receiving an analog signal that includes a carrier signal and data, an analog-to-digital converter converting the analog signal to a digital signal, and a filter filtering the digital signal. The transmitting module includes a direct current-direct current (DC-DC) converter having an operating frequency belonging to a stop band of the filter, and a transmitter receiving power from the DC-DC converter to operate and receiving a system clock signal to transmit the carrier signal.

According to an aspect of the present inventive concept, an NFC device may include a receiver receiving an analog signal including a carrier signal and data, an analog-to-digital converter converting the analog signal into a digital signal, and a digital filter filtering the digital signal in a predetermined stop band. The stop band includes a frequency of a signal generated by dividing the carrier signal, and harmonic components of the frequency.

According to an aspect of the present inventive concept, an NFC device may include a clock generating unit generating a system clock signal, a transmitter amplifying the system clock signal to generate a carrier signal required for NFC, a DC-DC converter supplying a power supply voltage required for an operation of the transmitter, and a DC-DC control unit determining a control method of the DC-DC converter depending on whether an NFC tag receiving the carrier signal is present.

BRIEF DESCRIPTION OF DRAWINGS

The above, and other aspects, features, and advantages of the present disclosure will be more clearly understood from the following detailed description when taken in conjunction with the accompanying drawings, in which.

DETAILED DESCRIPTION

Hereinafter, the example embodiments of the present inventive concept will be described as follows with reference to the attached drawings.

Figure 1:
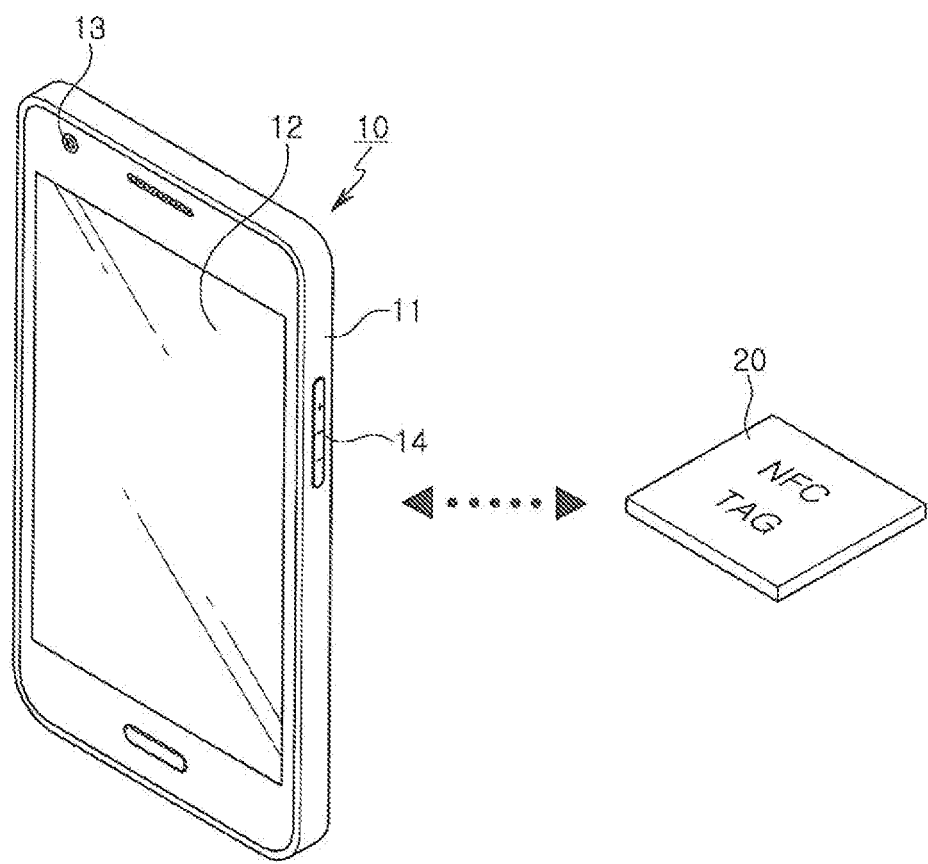
FIG. 1 is a view of an electronic device including a near field communication (NFC) device according to an example embodiment.

FIG. 1 is a view of an electronic device including a near field communication (NFC) device according to an example embodiment.

Referring to FIG. 1, the electronic device 10 according to an example embodiment may include a housing 11, a display 12, a camera unit 13, and an input unit 14. The electronic device 10 is illustrated as a mobile device, such as a smartphone, a tablet personal computer (PC), or a laptop PC. However, the NFC device according to an example embodiment may also be applied, to other various devices, such as a desktop PC, a home television, a set-top box, a refrigerator, and a washing machine.

The NFC device included in the electronic device 10 may communicate with an NFC tag 20, using a carrier signal in a particular frequency band. A carrier signal that the NFC device transmits to the NFC tag 20 may not include data. The NFC tag 20 may generate power required for operations thereof, using the carrier signal received from the NFC device.

Further, the NFC tag 20 may include predetermined data in the carrier signal, and may transmit the carrier signal to the NFC device. For example, the NFC device may transmit the carrier signal without data to the NFC tag 20, and receive the carrier signal with the data from the NFC tag 20. In an example embodiment, a frequency of the carrier signal used in communications between the NFC device and the NFC tag 20 may be 13.56 MHz. In order to increase performance of the NFC device and the NFC tag 20, strength of the carrier signal output by the NFC device may be required to be increased. The NFC device may include a power amplifier (PA) and a DC-DC converter supplying a power supply voltage to the PA, in order to increase the strength of the carrier signal.

The DC-DC converter may operate according to a predetermined, switching frequency, and may include at least one switch device repeatedly turned on or off, according to the switching frequency. In an example embodiment, the switching frequency may be a frequency of a signal for controlling the at least one switch device. The power supply voltage that the DC-DC converter supplies to the power amplifier may include a ripple component generated by operations of the at least one switch device.

In an example embodiment, the power supply voltage that the DC-DC converter supplies to the power amplifier may be converted into a signal having the same frequency as that of the carrier signal, by operations of the power amplifier. Thus, the ripple component, included in the power supply voltage supplied by the DC-DC converter, may be reflected in the carrier signal output by the power amplifier, and may be transmitted to the NFC tag 20. The NFC tag 20 may include data in the carrier signal received from the NFC device, and may transmit the carrier signal including the data to the NFC device. Thus, the ripple component may also be included in the signal that the NFC device receives from the NFC tag 20. The ripple component may act as a noise component in a process of demodulating the signal received by the NFC device and extracting the data, and may cause a reduction in communications performance between the electronic device 10 and the NFC tag 20.

According to various example embodiments, the DC-DC converter may be applied to the NFC device, thus significantly improving communications performance. Furthermore, a size and power consumption of the NFC device may be reduced, and a noise component generated by the DC-DC converter may be removed effectively.

Figure 2:
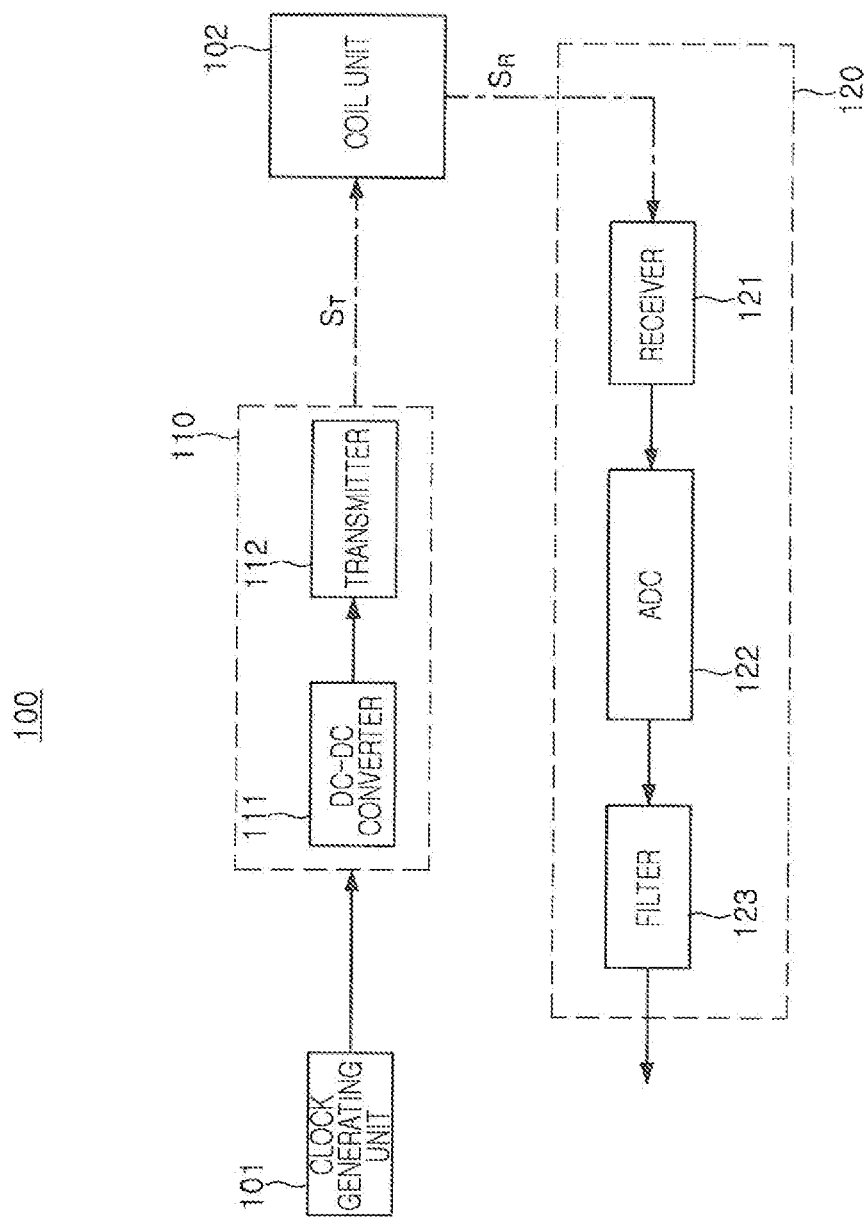
FIG. 2 is a schematic block diagram of an NFC device according to an example embodiment.
Figure 3:
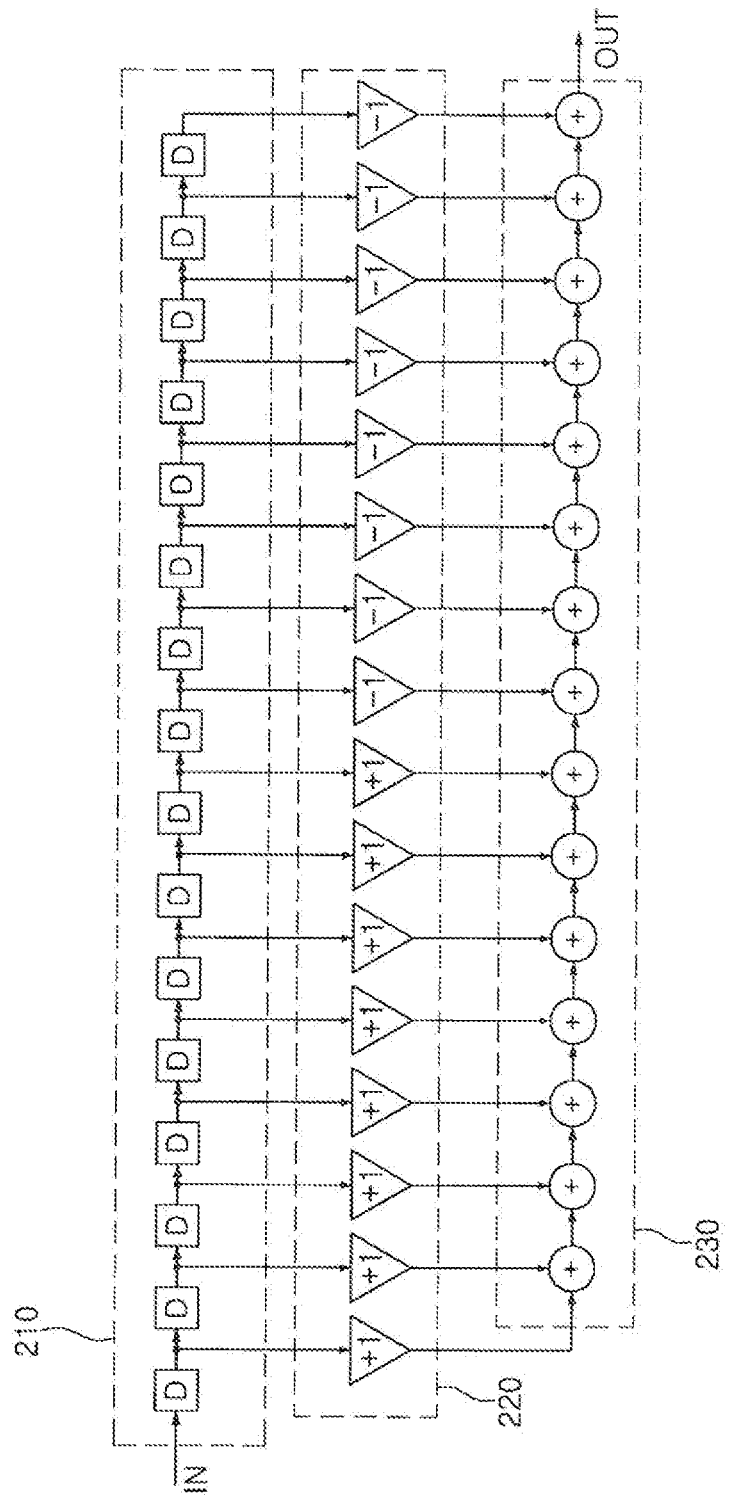
FIG. 3 is a schematic block diagram of a filter that may be included in an NFC device according to an example embodiment.

FIG. 2 is a schematic block diagram of an NFC device according to an example embodiment. FIG. 3 is a schematic block diagram of a filter that may be included in an NFC device according to an example embodiment.

Referring to FIG. 2, an NFC device 100 according to an example embodiment may include a clock generating unit 101, a coil unit 102, a transmitting module 110, and a receiving module 120. The transmitting module 110 may include a DC-DC converter 111 and a transmitter 112. The receiving module 120 may include a receiver 121, an analog-to-digital converter (ADC) 122, and a filter 123.

The clock generating unit 101 may generate a system clock signal having a predetermined frequency. In an example embodiment, a frequency of the system clock signal may be 13.56 MHz, and the system clock signal may be input to each of the DC-DC converter 111 and the transmitter 112. The transmitter 112 may amplify the system clock signal to generate a transmission signal $S_T$. In an example embodiment, a frequency of the transmission signal $S_T$ may be equal to that of the system clock signal, and a magnitude of the transmission signal $S_T$ may be greater than that of the system clock signal. The transmission signal $S_T$ may be transmitted to an NFC tag contiguous to the NFC device 100 through the coil unit 102.

The transmitter 112 may receive a power supply voltage required for an operation of amplifying the magnitude of the transmission signal $S_T$ from the DC-DC converter 111. In an example embodiment; the DC-DC converter 111 may be a boost converter including at least one switch device, and may change an output of the DC-DC converter 111 by controlling the at least one switch device. The at least one switch device may be controlled by a control signal having a predetermined frequency, and an operating frequency of the DC-DC converter 111 may be determined by the frequency of the control signal. The operating frequency of the DC-DC converter 111 may be equal to the frequency of the control signal, and may be lower than the frequency of the system clock signal. In an example embodiment, when the frequency of the system clock signal is 13.56 MHz, the operating frequency may have a value obtained by dividing the frequency of the system clock signal by an integer, such as 3.39 MHz or 1.695 MHz.

The coil unit 102 may transmit, to the receiver 121, a reception signal $S_R$ which the NFC tag contiguous to the NFC device 100 transmits. In an example embodiment, the receiver 121 may include an attenuator, a mixer, and an amplifier, and the reception signal $S_R$, having been subjected to a signal processing process in the receiver 121, may be converted into a digital signal by the analog-to-digital converter 122. An output terminal of the analog-to-digital converter 122 may be connected to the filter 123, and the filter 123 may be a digital filter filtering the digital signal. In an example embodiment, the filter 123 may remove a noise component generated by an operation of the DC-DC converter 111 and reflected in the transmission signal $S_T$ and the reception signal $S_R$.

In an example embodiment, the filter 123 may have a predetermined stop band in a frequency domain, and may remove a signal in the predetermined stop band. Referring to FIG. 3, illustrating a configuration of the filter 123, the filter 123 may be designed as a finite impulse response (FIR) filter, and may include a delay unit 210, a multiplication unit 220, and an addition unit 230. By designing the filter 123 as the FIR filter, the filter 123 may operate as a notch filter, selectively removing only a signal included in the stop band.

In an example embodiment, a notch frequency determining the stop band of the filter 123 and the operating frequency of the DC-DC converter 111 may be substantially the same as each other. For example, the operating frequency of the DC-DC converter 111 may be included in the stop band of the filter 123. Thus, the noise component generated by the operation of the DC-DC converter 111 and included in the transmission signal $S_T$ and the reception signal $S_R$ may be effectively removed by the filter 123, resulting in an improvement in a signal-to-noise ratio (SNR) of the NFC device 100.

Figure 4:
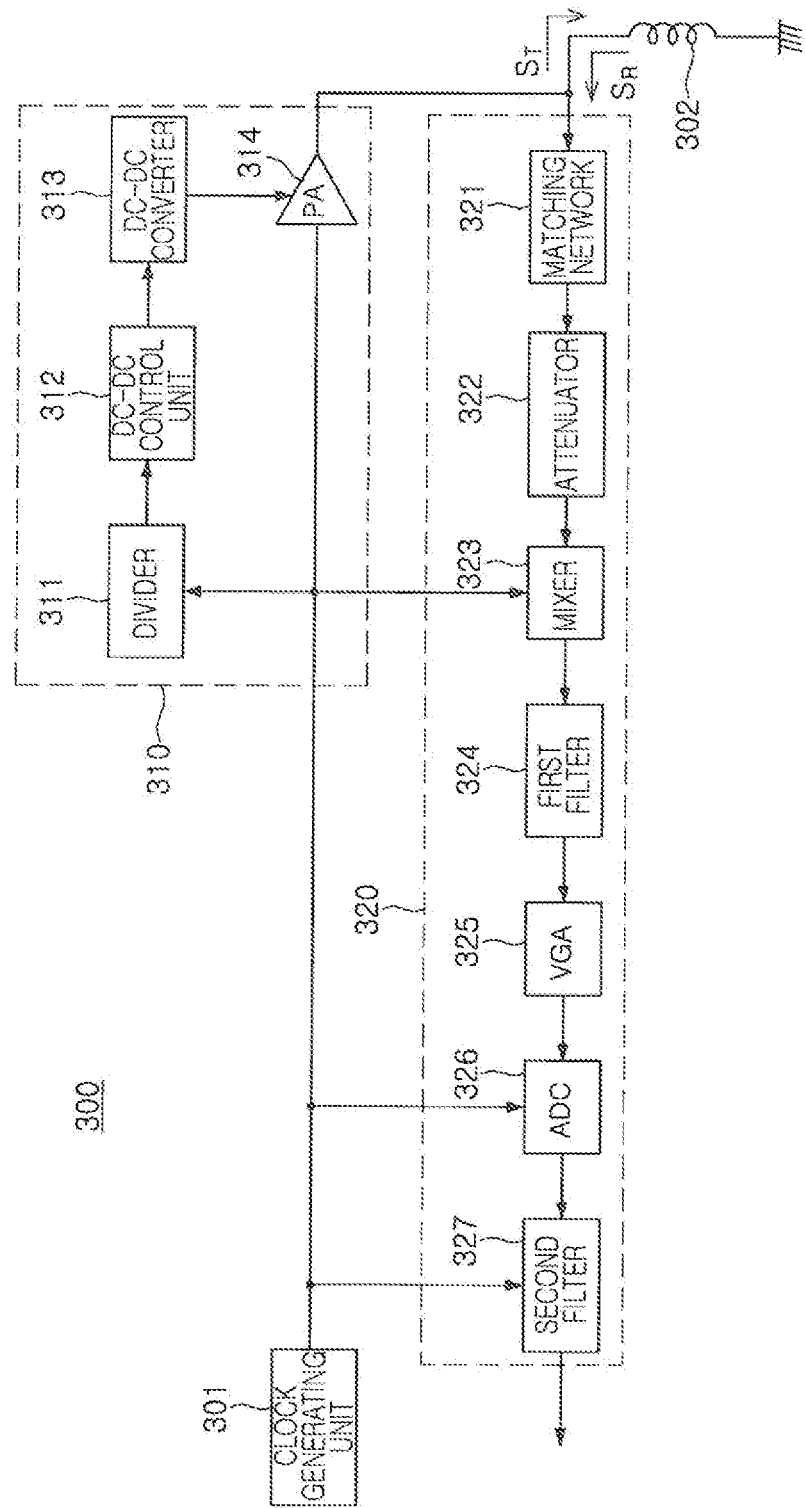
FIG. 4 is a schematic block diagram of an NFC device according to an example embodiment.

FIG. 4 is a schematic block, diagram of an NFC device 300 according to an example embodiment. FIGS. 5 through 13 are views illustrating operations of an NFC device according to an example embodiment. Hereinafter, operations of the NFC device according to an example embodiment will be described with reference to the schematic block diagram of FIG. 4 and the views of FIGS. 5 through 13.

Referring to FIG. 4, the NFC device 300 according to an example embodiment may include a clock generating unit 301, a coil unit 302, a transmitting module 310, and a receiving module 320. The transmitting module 310 may include a divider 311, a DC-DC control unit 312, a DC-DC converter 313, and a power amplifier (PA) 314. The receiving module 320 may include a matching network 321, an attenuator 322, a mixer 323, a first filter 324, a variable-gain amplifier (VGA) 325, an analog-to-digital converter (ADC) 326, and a second filter 327. Configurations of the transmitting module 310 and the receiving module 320 are not limited to those in the example embodiment illustrated in FIG. 4, and may be modified, in various ways.

The clock generating unit 301 may generate a system clock signal. In an example embodiment, a frequency of the system clock signal may be 13.56 MHz, an NFC communications frequency, or may be an integer multiple thereof. The system clock signal may be input to the divider 311 and the PA 314 of the transmitting module 310.

The power amplifier 314 may amplify the system clock signal to generate a transmission signal $S_T$ and the transmission signal $S_T$ may have the same frequency as that of the system clock signal. In an example embodiment, a magnitude of the transmission signal $S_T$ may be determined by a power supply voltage that the DC-DC converter 313 supplies to the power amplifier 314. The DC-DC control unit 312 may determine the magnitude of the transmission signal $S_T$ by adjusting the power supply voltage that the DC-DC converter 313 supplies to the power amplifier 314.

The divider 311 may divide the system clock signal to generate a divided signal having a frequency different from that of the system clock signal. In an example embodiment, the divided signal may have a frequency obtained by dividing the frequency of the system clock signal N times, where N is an integer. For example, when the frequency of the system clock signal is 13.56 MHz, the frequency of the divided signal may have a value such as 1.695 MHz or 3.39 MHz.

The DC-DC control unit 312 may generate a control signal for adjusting an output of the DC-DC converter 313, using the divided signal. The DC-DC control unit 312 may adjust a magnitude of the power supply voltage that the DC-DC converter 313 supplies to the power amplifier 314 by changing a duty ratio or frequency of the control signal. In an example embodiment, the DC-DC control unit 312 may change the duty ratio of the control signal when load is present in the NFC device 300, and may change the frequency of the control signal when no load is present in the NFC device 300, adjusting the magnitude of the power supply voltage output by the DC-DC converter 313. The DC-DC control unit 312 may determine whether load is present in the NFC device 300, based on a load current of the NFC device 300.

Under the condition that no load is present in the NFC device 300, the DC-DC control unit 312 may lower the frequency of the control signal, thus the operating frequency of the DC-DC converter 313 may be decreased. Thus, power consumption of the DC-DC converter 313 may be reduced under the condition that no load is present in the NFC device 300, and the overall power consumption of the NFC device 300 may be managed efficiently.

Under the condition that load is present in the NFC device 300, the DC-DC control unit 312 may select a frequency of the control signal appropriately. In an example embodiment, the DC-DC control unit 312 may select the frequency of the control signal as a value included in a stop band of the second filter 327 included in the receiving module 320. As an example, when the second filter 327 is a notch filter, the DC-DC control unit 312 may select the frequency of the control signal as a value substantially the same as a notch frequency of the second filter 327 or as harmonic components thereof. For example, when the notch frequency of the second filter 327 is 3.39 MHz and the frequency of the divided signal output by the divider 311 is 1.695 MHz, the DC-DC control unit 312 may generate a control signal having a frequency of 3.39 MHz, using the divided signal. By selecting the frequency of the control signal as the value included in the stop band of the second filter 327, the second filter 327 may effectively remove a noise component included in the transmission signal by an operation of the DC-DC converter 313.

The reception signal $S_R$ may include a carrier signal transmitted by an NFC tag, and data superimposed on the carrier signal, and the receiving module 320 may convert the data included in the reception signal $S_R$ into a digital domain. In an example embodiment, the reception signal $S_R$, transmitted by the NFC tag contiguous to the NFC device 300, may include data superimposed on the carrier signal in a sub-carrier frequency band. The attenuator 322 may appropriately reduce an amplitude of the reception signal $S_R$ and transmit the reception signal $S_R$ to the mixer 323, and the mixer 323 may convert a frequency of the reception signal $S_R$. In an example embodiment, the mixer 323 may down-convert the reception signal $S_R$ by a frequency of the carrier signal.

The first filter 324, as an analog filter, may be a high-pass filter or a band-pass filter, or may also include both the high-pass filter and the band-pass filter. The first filter 324 may remove a high-frequency noise component. As an example, the first filter 324 may remove a signal from a remaining frequency bandwidth, except for an NFC bandwidth.

An output of the first filter 324 may be input to the variable-gain amplifier 325. The variable-gain amplifier 325 may amplify an input signal by a predetermined gain, and may transmit the amplified input signal to the analog-to-digital converter 326. In an example embodiment, a gain of the variable-gain amplifier 325 and an attenuation amount of the attenuator 322 may be appropriately selected, such that an output of the analog-to-digital converter 326 may not be saturated by the noise component included in the reception signal $S_R$.

The second filter 327 may be a digital filter connected to an output terminal of the ADC 326, and may include a notch filter. For example, the second filter 327 may selectively remove a signal in a stop band, defined by a notch frequency and harmonic components thereof.

In an example embodiment, the notch frequency of the second filter 327 may be a predetermined value, and the DC-DC control unit 312 may determine the frequency of the control signal, with reference to the notch frequency or the harmonic components of the second filter 327. The frequency of the control signal generated by the DC-DC control unit 312 may be an operating frequency of the DC-DC converter 313, and the noise component, generated at the operating frequency by the operation of the DC-DC converter 313, may be present in the transmission signal $S_T$ and the reception signal $S_R$. In an example embodiment, the operating frequency may correspond to the notch frequency of the second filter 327 or to the harmonic components thereof, or may be included in the stop band of the second filter 327. Thus, the noise component, included in the reception signal $S_R$ in an operating frequency band, may be removed by the second filter 327.

In an example embodiment, the notch frequency of the second filter 327 may be a changeable value. When the notch frequency of the second filter 327 is changeable, the notch frequency may be determined in consideration of the operating frequency of the DC-DC converter 313. Alternatively, the notch frequency may be selected such that the harmonic components of the notch frequency correspond to the operating frequency of the DC-DC converter 313. In an alternative example embodiment, the notch frequency may be appropriately selected such that the operating frequency of the DC-DC converter 313 may be included in the stop band of the second filter 327.

In addition, in an example embodiment, the frequency of the control signal adjusting the output of the DC-DC converter 313, a frequency of the reception signal $S_R$ required for frequency conversion of the mixer 323, a sampling frequency of the analog-to-digital converter 326, and the notch frequency of the second filter 327 may be determined from the frequency of the system clock signal generated by the clock generating unit 301. When the frequency of the system, clock signal varies, the variation in the frequency of the system clock signal may be reflected in both the transmitting module 310 and the receiving module 320. Thus, the frequency variation of the system clock signal may be naturally offset in the transmitting module 310 and the receiving module 320 to prevent a reduction in filtering performance of the second filter 327 due to the frequency variation of the system clock signal, thus efficiently improving an signal-to-noise ratio of the NFC device 300.

Hereinafter, characteristics of input and output signals of the primary components will be described with reference to FIGS. 4 and 5 through 13.

Figure 5:
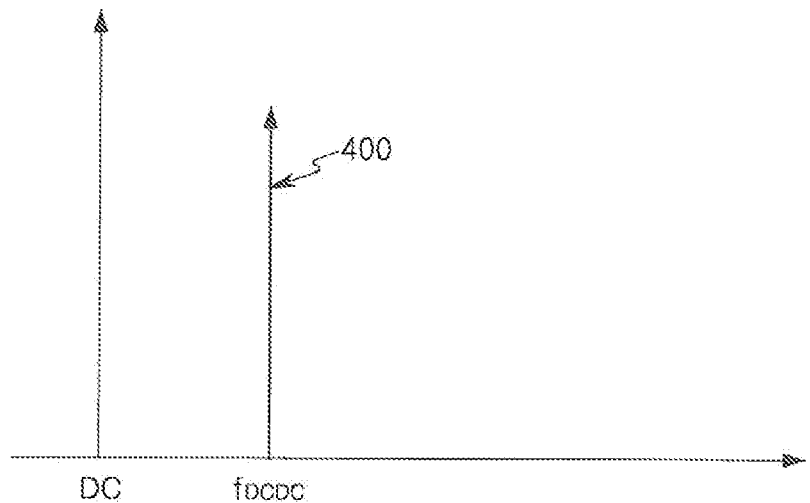
FIGS. 5 through 13 are views illustrating operations of an NFC device according to an example embodiment.
Figure 6:
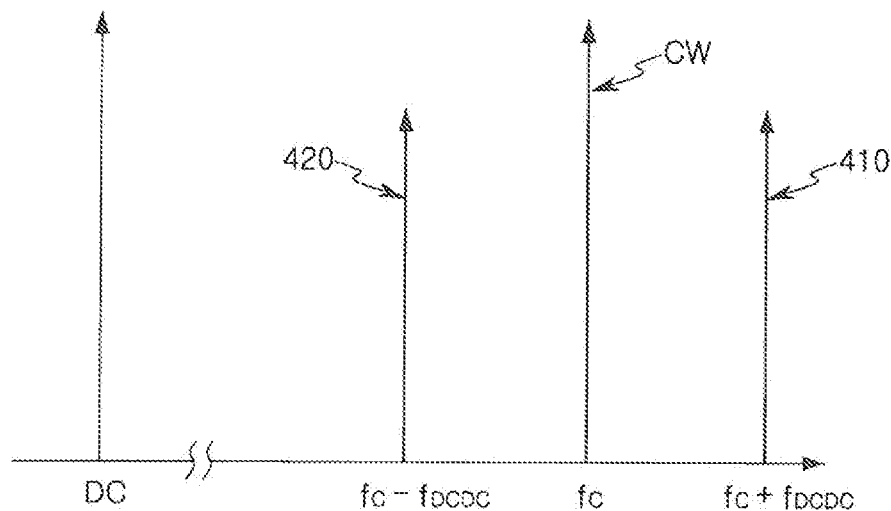

FIG. 5 is a view illustrating a frequency spectrum of the power supply voltage that the DC-DC converter 313 supplies to the power amplifier 314. Referring to FIG. 5, the power supply voltage may further include a noise component 400 generated at an operating frequency $f_{DCDC}$, in addition to a direct current (DC) component having a frequency of 0. In an example embodiment, the power supply voltage may also further include a noise component generated by harmonic components of the operating frequency $f_{DCDC}$, in addition to the noise component generated at the operating frequency $f_{DCDC}$ of the DC-DC converter 313.

The power amplifier 314 may operate by the power supply voltage supplied by the DC-DC converter 313. In a process of generating the transmission signal $S_T$ by the power amplifier 314, the noise component 400 included, in the power supply voltage may be converted in frequency by a carrier frequency $f_C$ of the transmission signal $S_T$. Referring to FIG. 5, illustrating a frequency spectrum of the transmission signal $S_T$, the transmission signal $S_T$ may include a first noise component 410 and a second noise component 420 that appear at a first frequency $f_C+f_{DCDC}$ and a second frequency $f_C-f_{DCDC}$ respectively, in addition to a carrier signal CW having the carrier frequency $f_C$.

Figure 7:
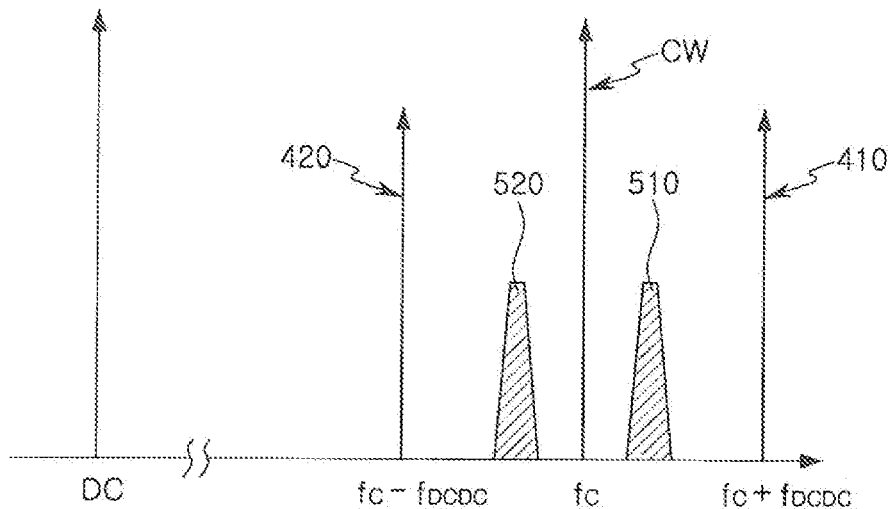

FIG. 7 is a view illustrating a frequency spectrum of the reception signal $S_R$ input to the matching network 321. In an example embodiment, the reception signal may have the same carrier frequency $f_C$ as the transmission signal $S_T$ has, and may include a first noise component 410 and a second noise component 420 that appear at a first frequency $f_C+f_{DCDC}$ and a second frequency $f_C-f_{DCDC}$, respectively, as the transmission signal $S_T$ includes. For example, the first and second noise components 410 and 420, generated by the DC-DC converter 313 and reflected in the transmission signal $S_T$, may return to the receiving module 320 through the reception signal $S_R$.

Unlike the transmission signal $S_T$ that includes no data, the reception signal $S_R$ may include first NFC data 510 and second NFC data 520. The first and second NFC data 510 and 520 may include the same information, may be superimposed on a carrier signal in a predetermined sub-carrier frequency band, and may be transmitted. In an example embodiment, a sub-carrier frequency may be lower than a switching frequency $f_{DCDC}$ of the DC-DC converter 313, and may be a level of several hundred kHz.

The first and second NFC data 510 and 520, transmitted on the sub-carrier frequency band, may have magnitudes less than those of the first and second noise components 410 and 420 that appear at the first and second frequencies $f_C+f_{DCDC}$ and $f_C-f_{DCDC}$, respectively. In an example embodiment, the first and second noise components 410 and 420 may have magnitudes several to dozens of times greater than or equal to those of the first and second NFC data 510 and 520.

Figure 8:
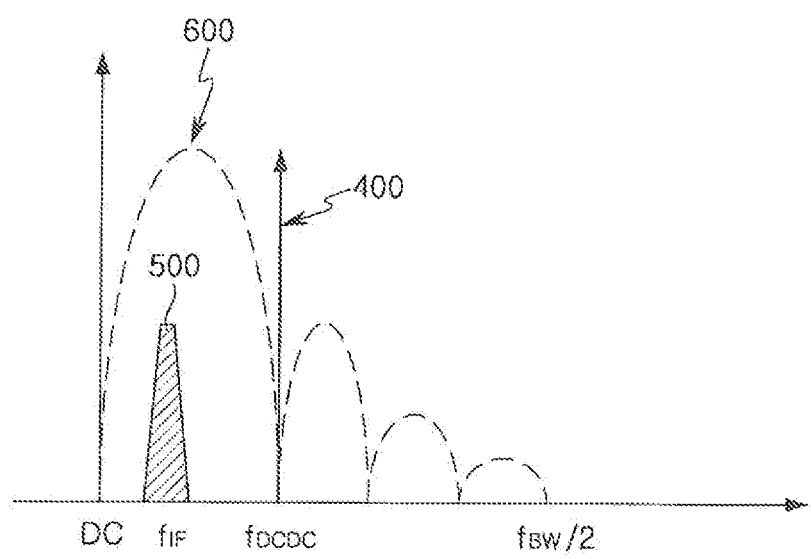

The reception signal $S_R$ may be down-converted by the carrier frequency $f_C$ in the mixer 323, and the variable-gain amplifier 325 may adjust a magnitude of the down-converted reception signal $S_R$. Referring to FIG. 8 that illustrates an input of the second filter 327 as a frequency spectrum, NFC data 500, at the input of the second filter 327, may be present at a sub-carrier frequency $f_{IF}$, and the noise component 400, at the input of the second filter 327, may be present at the operating frequency $f_{DCDC}$ of the DC-DC converter 313.

As described above, the second filter 327 may have characteristics of the notch filter, selectively blocking a signal in a particular frequency band. When FIG. 8, illustrating an output of the mixer 323 as a frequency spectrum, is compared to FIG. 9, illustrating an output of the second filter 327 as a frequency spectrum, the noise component 400 may have been removed by the second filter 327.

Figure 9:
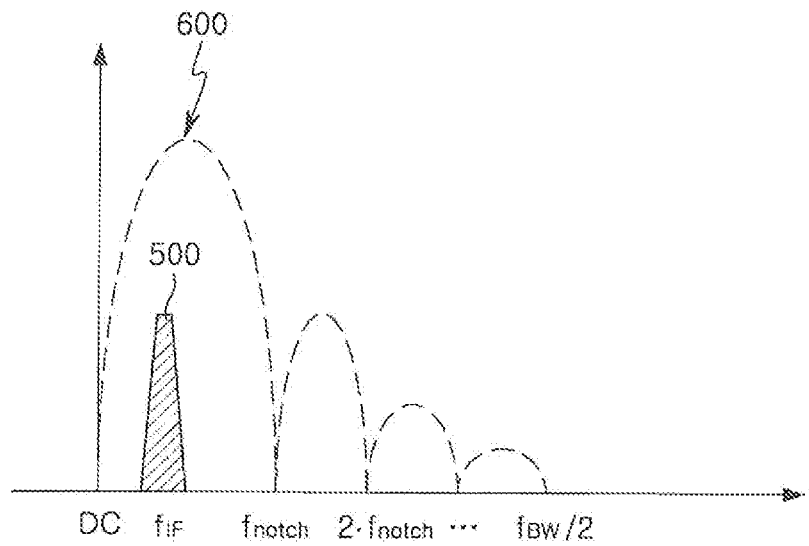

Referring to FIGS. 8 and 9, a notch frequency, a frequency at which a signal is blocked by a mask 600 of the second filter 327, may be substantially the same as at least one of the operating frequency $f_{DCDC}$ and the harmonic components thereof. For example, the operating frequency $f_{DCDC}$ of the DC-DC converter 313 and the harmonic components thereof may be included in the stop band in which the second filter 327 may remove the signal. The stop band of the second filter 327 may include a plurality of frequency bands corresponding to the operating frequency $f_{DCDC}$ of the DC-DC converter 313 and the harmonic components thereof. Thus, the noise component 400, appearing at the operating frequency $f_{DCDC}$ or in the harmonic components thereof, may be removed by the second filter 327. In an example embodiment, the second filter 327 may be implemented as an FIR filter having impulse response characteristics in a finite interval.

Referring again to FIG. 9 illustrating the output of the second filter 327 as the frequency spectrum, the noise component 400 of the operating frequency $f_{DCDC}$ or of the harmonic components thereof may be removed, and only the NFC data 500 may remain. This may be an effect obtained from design features that the operating frequency $f_{DCDC}$ of the DC-DC converter 313 and the harmonic components thereof may be included in the stop band of the second filter 327. In an example embodiment, the signal-to-noise ratio of the NFC device 300 may be improved by substantially matching the operating frequency $f_{DCDC}$ of the DC-DC converter 313 included in the transmitting module 310, with the notch frequency of the second filter 327 included in the receiving module 320.

Figure 10:
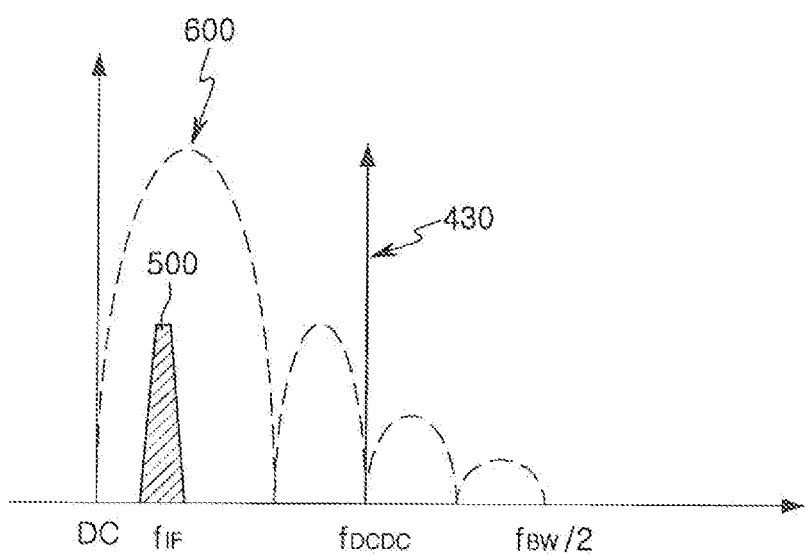
Figure 11:
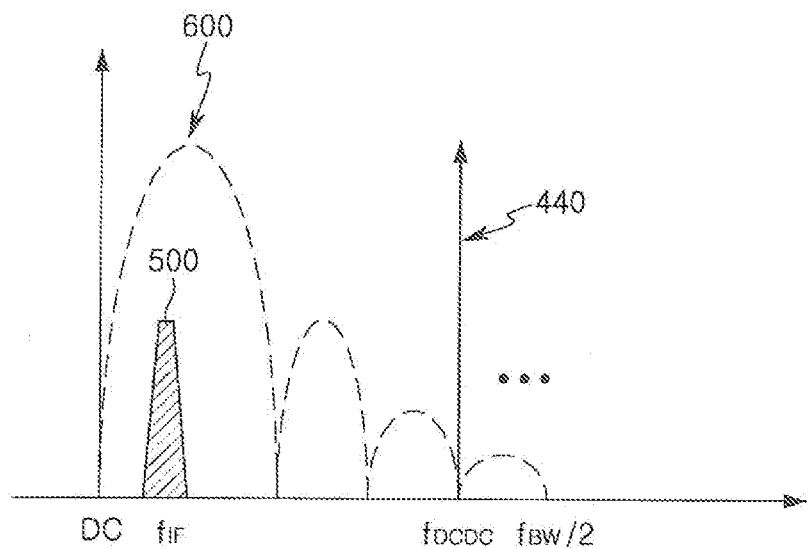

FIG. 10 is a view illustrating a signal, input to the second filter 327, as a frequency spectrum, when the operating frequency $f_{DCDC}$ of the DC-DC converter 313 is substantially equal to twice a notch frequency $f_{notch}$ of the second filter 327. FIG. 11 is a view illustrating a signal, input to the second filter 327, as a frequency spectrum, when the operating frequency $f_{DCDC}$ of the DC-DC converter 313 is substantially equal to three times the notch frequency $f_{notch}$ of the second filter 327. In the example embodiments illustrated in FIGS. 10 and 11, each of noise components 430 and 440, generated by the DC-DC converter 313, may be present at the operating frequency $f_{DCDC}$ of the DC-DC converter 313. Referring to the mask 600 of the second filter 327, the operating frequency $f_{DCDC}$ may be included in the stop band of the second filter 327. Thus, the noise components 430 and 440 present at the operating frequency $f_{DCDC}$ may be effectively removed.

Figure 12:
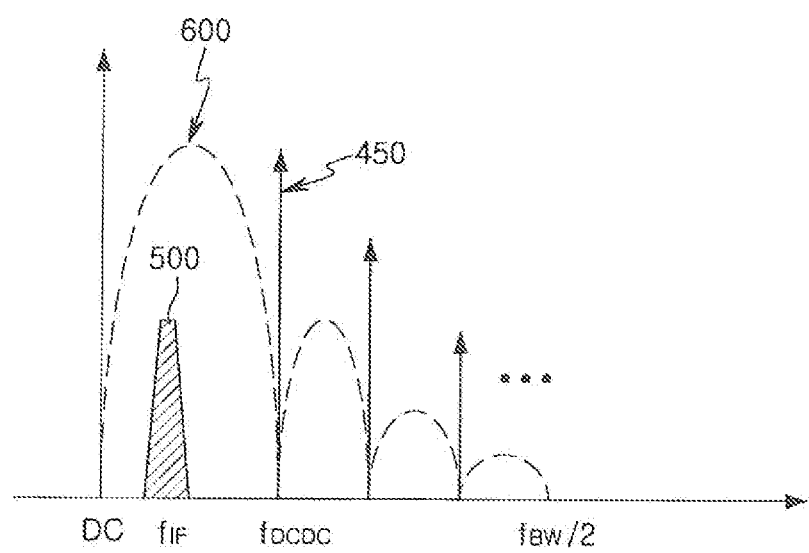
Figure 13:
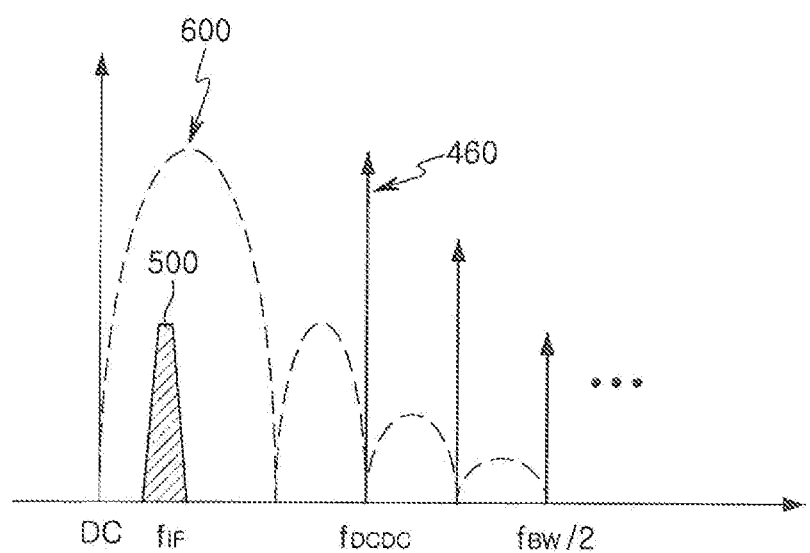

FIG. 12 is a view illustrating an input of the second filter 327 as a frequency spectrum, when the operating frequency $f_{DCDC}$ of the DC-DC converter 313 is equal to the notch frequency $f_{notch}$ of the second filter 327 and noise components 450 are present at the operating frequency $f_{DCDC}$ and in the harmonic components thereof. FIG. 13 is a view illustrating an input of the second filter 327 as a frequency spectrum, when the operating frequency $f_{DCDC}$ of the DC-DC converter 313 is equal to twice the notch frequency $f_{notch}$ of the second filter 327 and noise components 460 are present at the operating frequency $f_{DCDC}$ and in the harmonic components thereof. In each of the example embodiments illustrated in FIGS. 12 and 13, the operating frequency $f_{DCDC}$ and the harmonic components thereof may be included in a stop band defined by the notch frequency $f_{notch}$ of the second filter 327 and the harmonic components thereof. Thus, the second filter 327 may remove effectively the noise components 450 and 460.

Figure 14:
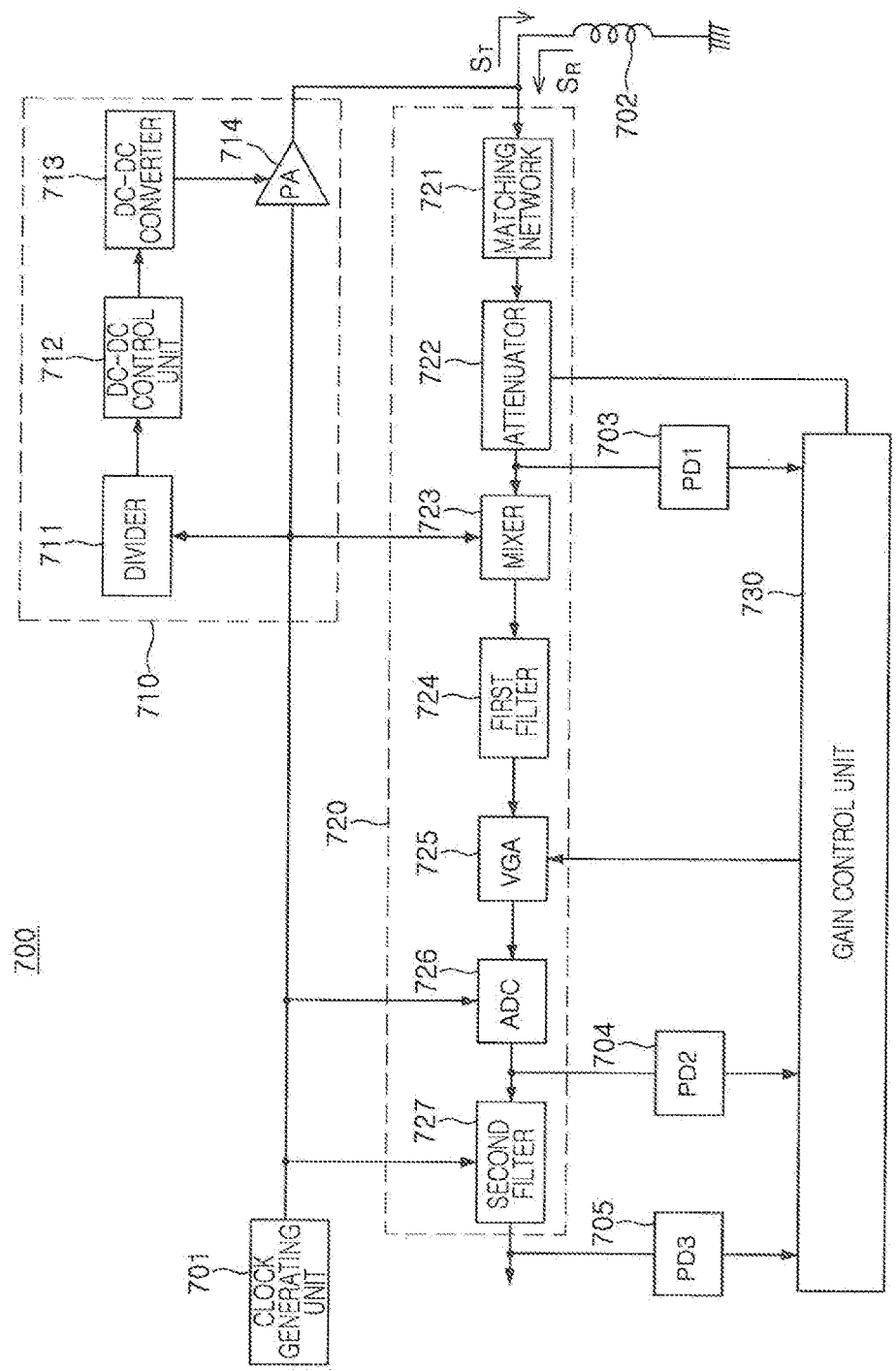
FIG. 14 is a schematic block diagram of an NFC device according to an example embodiment.

FIG. 14 is a schematic block diagram of an NFC device according to an example embodiment.

Referring to FIG. 14, an NFC device 700 according to an example embodiment may include a clock generating unit 701, a coil unit 702, a transmitting module 710, a receiving module 720, and a gain control unit 730. The transmitting module 710 may include a divider 711, a DC-DC control unit 712, a DC-DC converter 713, and a power amplifier 714. The receiving module 720 may include a matching network 721, an attenuator 722, a mixer 723, a first filter 724, a variable-gain amplifier 725, an analog-to-digital converter 726, and a second filter 727. Operations of the transmitting module 710 and the receiving module 720 may be similar to those of the transmitting module 310 and the receiving module 320 according to the example embodiment illustrated in FIG. 4.

The gain control unit 730 may detect magnitudes of at least some signals from the receiving module 720 by first to third power detectors (PD1 to PD3) 703 to 705. The gain control unit 730 may control the attenuator 722 and the variable-gain amplifier 725, based on the magnitudes of the at least some signals detected by the first to third power detectors 703 to 705.

The first power detector 703 may detect a magnitude of a signal at an input terminal of the mixer 723. The gain control unit 730 may adjust an attenuation amount of the attenuator 722 with reference to the detection result of the first power detector 703. In an example embodiment, the gain control unit 730 may adjust the attenuation amount of the attenuator 722, such that a signal input to the mixer 723 may have sufficient linearity.

The second power detector 704 may detect the magnitude of the signal at an output terminal of the ADC 726, and the third power detector 705 may detect the magnitude of the signal at an output terminal of the second filter 727. The second power detector 704 and the third power detector 705 may be provided to obtain a maximum value of the signal-to-noise ratio, while preventing an analog signal, input to the analog-to-digital converter 726, from being saturated. For example, when the gain control unit 730 changes a gain of the variable-gain amplifier 725, the gain control unit 730 may consider the detection result of each of the second power detector 704 and the third power detector 705.

In an example embodiment, when it is difficult to obtain a sufficient signal-to-noise ratio, due to a small magnitude of signal detected at the output terminal of the second filter 727 by the third power detector 705, the gain control unit 730 may refer to the magnitude of the signal detected at the output terminal of the analog-to-digital converter 726. When the magnitude of the signal detected at the output terminal of the analog-to-digital converter 726 is at saturation point, it may be assumed that an analog signal having a magnitude outside a dynamic range of the analog-to-digital converter 726 is input to the analog-to-digital converter 726.

Thus, when the magnitude of the signal detected by the second power detector 704 is at saturation point, the gain control unit 730 may lower the gain of the variable gain amplifier 725. In contrast, when the magnitude of the signal detected by the second power detector 704 is not at saturation point, the gain control unit 730 may raise the gain of the variable-gain amplifier 725 to improve the signal-to-noise ratio.

When adjusting the gain of the variable-gain amplifier 725 with reference to only the signal detected at the output terminal of the second filter 727, the gain control unit 730 may increase the gain of the variable-gain amplifier 725 if the signal detected at the output terminal of the second filter 727 is weak, so that the analog signal having the magnitude outside the dynamic range may be input to the variable-gain amplifier 726. In an example embodiment, when the magnitude of the signal detected by the third power detector 705 is small, the gain control unit. 730 may determine whether the output of the analog-to-digital converter 726 is saturated, based on the magnitude of the signal detected by the second power detector 704, and increase or decrease the gain of the variable-gain amplifier 725. Thus, setting an optimal gain value may allow an excellent signal-to-noise ratio, while preventing the output of the analog-to-digital converter 726 from being saturated.

Figure 15:
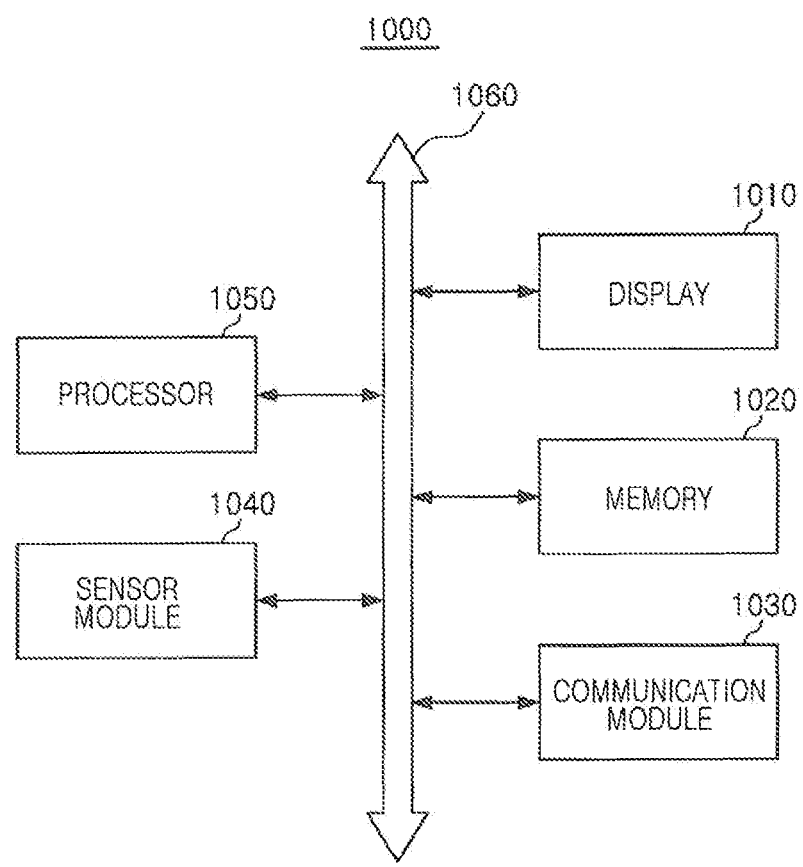
FIG. 15 is a block diagram of an electronic device including an NFC device according to an example embodiment.

FIG. 15 is a block diagram of an electronic device including an NFC device according to an example embodiment.

Referring to FIG. 15, an electronic device 1000 according to an example embodiment may include a display 1010, a memory 1020, a communications module 1030, a sensor module 1040, and a processor 1050. The electronic device 1000 may include a television and a desktop personal computer (PC), in addition to a mobile device, such as a smartphone, a tablet PC, or a laptop PC. The components, such as the display 1010, the memory 1020, the communications module 1030, the sensor module 1040, and the processor 1050, may communicate with each other through a bus 1060.

The communications module 1030 may include the NFC device according to various example embodiments. To improve performance, the transmitting module of the NFC device may include the power amplifier and the DC-DC converter, supplying a power supply voltage to the power amplifier. The power amplifier may amplify the magnitude of the carrier signal required for NFC communications. The electronic device 1000 may include various communications modules and, in recent years, the electronic device 1000 including a wireless charging module has been increasing. Thus, when the magnitude of the carrier signal required for NFC communications is small, performance may be reduced and, in an embodiment, the power amplifier may be employed in the transmitting module of the NFC device, solving the above-mentioned issue.

The receiving module of the NFC device may include the notch filter in order to improve the SNR by effectively removing the noise component included in the reception signal. The switching frequency of the DC-DC converter may correspond to the notch frequency of the notch filter or the harmonic components thereof. Thus, the notch filter may remove the noise component included in the output of the power amplifier receiving the power supply voltage from the DC-DC converter, resulting in an improvement in the SNR.

As set forth above, according to example embodiments of the present inventive concept, an NFC device may increase an NFC distance, using a transmitter that receives power from a direct current-direct current (DC-DC) converter to generate a carrier signal, while effectively removing noise components included in the carrier signal by the DC-DC converter by providing a filter in a signal receiving unit. Further, power consumption of the NFC device may be efficiently managed by determining an operating mode of the DC-DC converter according to an operating state of the NFC device.

While exemplary embodiments have been shown and described above, it will, be apparent to those skilled in the art that modifications and variations could be made without departing from the scope of the present inventive concept.

What is claimed is:

1. A near field communication (NFC) device comprising:
   a receiving module comprising a receiver configured to receive an analog signal comprising a carrier signal and data, an analog-to-digital converter configured to convert the analog signal to a digital signal, and a filter configured to filter the digital signal; and
   a transmitting module comprising a direct current-direct current (DC-DC) converter having an operating frequency belonging to a stop band of the filter, and a transmitter configured to receive power from the DC-DC converter and configured to receive a system clock signal.

2. The NFC device of claim 1, wherein the transmitting module comprises a divider configured to divide the system clock signal to generate a divided signal having a frequency different from a frequency of the system clock signal, and a DC-DC control circuit configured to generate a control signal for adjusting an output of the DC-DC converter, using the divided signal.

3. The NFC device of claim 2, wherein a frequency of the control signal is the operating frequency that is equal to the frequency of the divided signal or an integer multiple of the frequency of the divided signal.

4. The NFC device of claim 2, wherein the DC-DC control circuit is configured to control the DC-DC converter, depending on any one of a pulse-width modulation mode and a pulse-frequency modulation mode, according to load conditions.

5. The NFC device of claim 1, wherein the receiving module comprises an attenuator configured to attenuate the analog signal, a mixer configured to down-convert an output of the attenuator in a frequency band, and a variable-gain amplifier configured to amplify an output of the mixer and configured to input the amplified output to the analog-to-digital converter.

6. The NFC device of claim 5, further comprising a gain control circuit configured to adjust at least one of an attenuation amount of the attenuator and a gain of the variable-gain amplifier.

7. The NFC device of claim 6, wherein the gain control circuit is configured to detect an output of the attenuation amount to adjust the attenuation amount and is configured to detect an output of the analog-to-digital converter and an output of the filter to adjust the gain of the variable-gain amplifier.

8. The NFC device of claim 7, wherein the gain control circuit is configured to lower the gain of the variable-gain amplifier when a signal-to-noise ratio calculated from the output of the filter is less than a reference value, and the output of the analog-to-digital converter is saturated.

9. The NFC device of claim 7, wherein the gain control circuit is configured to raise the gain of the variable-gain amplifier when a signal-to-noise ratio calculated from the output of the filter is less than a reference value, and the output of the analog-to-digital converter is not saturated.

10. The NFC device of claim 1, wherein a sampling frequency of the analog-to-digital converter is equal to a frequency of the system clock signal.

11. The NFC device of claim 1, wherein the transmitter comprises a power amplifier configured to receive the system clock signal to generate the carrier signal, and the DC-DC converter is configured to supply power to the power amplifier.

12. The NFC device of claim 1, wherein the stop band comprises a plurality of frequency bands separated from each other, and the operating frequency is included in at least one of the plurality of frequency bands.

13. The NFC device of claim 1, wherein the filter includes a notch filter configured to remove at least a portion of the digital signal in a frequency band.

14. The NFC device of claim 13, wherein the notch filter is configured to remove the operating frequency and/or harmonics of the operating frequency from the digital signal.

15. A near field communication (NFC) device comprising:
    a receiver configured to receive an analog signal comprising a carrier signal and data;
    an analog-to-digital converter configured to convert the analog signal into a digital signal;
    a digital filter configured to filter the digital signal in a stop band that comprises a frequency of a signal generated by dividing the carrier signal and comprises harmonic components of the frequency.

16. The NFC device of claim 15, further comprising an analog filter connected between the receiver and the analog-to-digital converter and configured to filter the analog signal in a frequency band different from the stop band of the digital filter.

17. The NFC device of claim 15, further comprising:
    an amplifier connected between the receiver and the analog-to-digital converter and configured to amplify the analog signal input to the analog-to-digital converter by a predetermined gain; and
    a gain control circuit configured to adjust a gain of the amplifier.

18. The NFC device of claim 17, wherein the gain control circuit is configured to adjust the gain of the amplifier such that an output of the analog-to-digital converter is not saturated.

19. The NFC device of claim 17, wherein the gain control circuit is configured to detect the digital signal output by the analog-to-digital converter and an output of the digital filter to adjust the gain of the amplifier.

20. A near field communication (NFC) device comprising:
    a clock generating circuit configured to generate a system clock signal;
    a transmitter configured to amplify the system clock signal to generate a carrier signal;
    a direct current-direct current (DC-DC) converter configured to supply a power supply voltage; and
    a DC-DC control circuit configured to determine a control method of the DC-DC converter depending on whether an NFC tag receiving the carrier signal is present,
    wherein the DC-DC control circuit is configured to control the DC-DC converter according to a pulse-width modulation mode in response to detecting that the NFC tag receiving the carrier signal is present and is configured to control the DC-DC converter according to a pulse-frequency modulation mode in response to detecting that the NFC tag receiving the carrier signal is absent.

\* \* \* \* \*